United States Patent
Dogan et al.

(10) Patent No.: US 10,985,699 B2
(45) Date of Patent: Apr. 20, 2021

(54) DIFFERENTIAL CONSTRUCTIVE WAVE OSCILLATOR DEVICE

(71) Applicant: North Carolina A&T State University, Greensboro, NC (US)

(72) Inventors: Numan S. Dogan, Greensboro, NC (US); Goker Ariyak, Greensboro, NC (US)

(73) Assignee: North Carolina A&T State University, Greensboro, NC (US)

( * ) Notice: Subject to any disclaimer, the term of this patent is extended or adjusted under 35 U.S.C. 154(b) by 0 days.

(21) Appl. No.: 16/291,642

(22) Filed: Mar. 4, 2019

(65) Prior Publication Data

US 2019/0273468 A1    Sep. 5, 2019

Related U.S. Application Data

(60) Provisional application No. 62/637,734, filed on Mar. 2, 2018.

(51) Int. Cl.
*H03B 9/01* (2006.01)
*H03B 9/12* (2006.01)
(Continued)

(52) U.S. Cl.
CPC ............ *H03B 9/12* (2013.01); *H01P 1/184* (2013.01); *H01P 3/08* (2013.01); *H03F 3/4508* (2013.01);
(Continued)

(58) Field of Classification Search
CPC ........ H03B 9/12; H03B 5/1847; H03B 9/147; H03F 3/68; H03F 3/4508; H03F 3/55;
(Continued)

(56) References Cited

U.S. PATENT DOCUMENTS 7,218,180 B2 * 5/2007 Wood .................. H03B 5/1852
  331/107 DP
8,169,267 B2   5/2012 LeGrandDeMercey
(Continued)

OTHER PUBLICATIONS

Gathman, T.D. and Buckwalter, J.F., Jun. 2013, A 92-GHz deterministic quadrature oscillator and N-push modulator in 120-nm SiGe BiCMOS. In 2013 IEEE MTT-S International Microwave Symposium Digest (MTT) (pp. 1-4). IEEE.

*Primary Examiner* — Richard Tan
(74) *Attorney, Agent, or Firm* — Fox Rothschild LLP

(57) ABSTRACT

A differential constructive wave oscillator device including a single, continuous differential transmission line that is arranged into first and second parallel traces in the form of a Mobius loop. The continuous transmission line includes first and second crossover points, each of which provides for a point of inflection between the first and second traces. In each stage of the device, both the first and second traces of the transmission line carry the forward traveling wave signal from a differential input port to a differential output port. Each phase includes a differential delay section that provides for a phase shift between a signal on the first trace and a signal on the second trace. Each phase additionally includes a differential feedback amplifier that amplifies the forward traveling wave signal at the differential output port, generates a differential feedback signal, and routes the differential feedback signal to the differential input port.

13 Claims, 11 Drawing Sheets

(51) Int. Cl.
   *H01P 3/08* (2006.01)
   *H03F 3/55* (2006.01)
   *H01P 1/18* (2006.01)
   *H03F 3/45* (2006.01)
   *H03F 3/68* (2006.01)

(52) U.S. Cl.
   CPC .............. *H03F 3/55* (2013.01); *H03F 3/68* (2013.01); *H03F 2200/255* (2013.01); *H03F 2200/423* (2013.01)

(58) Field of Classification Search
   CPC ......... H03F 2200/423; H03F 2200/255; H03F 3/602; H03F 2200/451; H01P 1/184; H01P 3/08
   USPC ............................................ 331/104, 107 SL
   See application file for complete search history.

(56) References Cited

U.S. PATENT DOCUMENTS

| | | |
   |---|---|---|
   | 8,258,873 B2 | 9/2012 | Buckwalter |
   | 8,581,668 B2 | 11/2013 | Martchovsky |
   | 8,791,765 B2 | 7/2014 | Emira et al. |
   | 2010/0117744 A1* | 5/2010 | Takinami ............. H03K 3/0315 331/45 |

* cited by examiner

DIFFERENTIAL CONSTRUCTIVE WAVE OSCILLATOR DEVICE

CROSS-REFERENCE TO RELATED PATENT APPLICATIONS

This patent application claims the benefit of U.S. provisional patent application Ser. No. 62/637,734 filed 2 Mar. 2018. The priority of the '734 application is claimed under 35 USC 120.

STATEMENT OF GOVERNMENT INTEREST

This invention was made with government support under government contract number W911NF-13-1-0114 awarded by the Department of Defense-Army Research Office. The government has certain rights in the invention.

FIELD

Some embodiments of the inventive concepts relate generally to oscillator devices and, more particularly, to constructive wave oscillator devices.

BACKGROUND

Millimeter-wave frequency integrated circuits may be used, for example, in communication, radar, and imaging applications. Traditionally, W-band (75-110 GHz) circuits have relied on GaAs or InP devices, but some silicon integrated circuits have been developed. At millimeter-wave frequencies, new challenges exist for silicon wideband circuits. Circuit designers may be confronted with concerns of process variations, as well as the low quality factor of passives, as the emphasis is on employing high-frequency circuits in monolithic arrays.

Two known designs for high-frequency and high-speed amplifiers are the cascaded lumped-element amplifier and the traveling-wave amplifier. In a cascaded lumped-element amplifier, the overall voltage gain may be the product of the gain of individual stages. In a traveling-wave amplifier, distributed amplifiers may absorb active device capacitances into an artificial transmission line along the input and output transmission lines. The input traveling wave may propagate along the input transmission line and two output traveling waves may be generated at the drain of each stage. A forward traveling wave may be constructively amplified across multiple stages and an undesired backward traveling wave may be attenuated in the backward termination impedance. However, combining the output forward traveling wave at each stage of the constructive wave amplifier may result in a lower overall voltage gain.

FIG. 1 is a schematic diagram illustrating a prior art cascaded constructive wave amplifier (CCWA) according to J. F. Buckwalter and J. Kim, "Cascaded constructive wave amplification," IEEE Transactions on Microwave Theory and Techniques, vol. 58, pp. 506-517, 2010. Referring to FIG. 1, in a cascaded constructive wave amplifier 100, a forward traveling wave may propagate from an input port 110 to an output port 130 while increasing in amplitude based on constructive interference from one or more feedback stages 120. The CCWA is a hybridization of traveling wave and cascaded amplifier designs.

FIG. 2 is a schematic diagram illustrating a prior art single-ended constructive wave oscillator (CWO) according to Timothy D. Gathman, James F. Buckwalter, "A 92-GHz deterministic quadrature oscillator and N-push modulator in 120-nm SiGe BiCMOS", Microwave Symposium Digest (IMS) 2013 IEEE MTT-S International, pp. 1-4, 2013, ISSN 0149-645X. Referring to FIG. 2, the CWO may include a plurality of traveling-wave stages that are arranged in a ring with delay and amplification based on the CCWA of FIG. 1. For example, the CWO illustrated in FIG. 2 includes four traveling-wave stages with the phase delay through each of the four stages being approximately 90° so that the total delay around the traveling-wave loop is 360°. Based on the delay and amplification, forward traveling waves may be amplified and backward traveling waves may be attenuated. Therefore, when constructed as illustrated in FIG. 2, the forward traveling wave may propagate only in a clockwise direction while the backward traveling wave may be attenuated.

FIG. 3 is a plan view of an implementation of the prior art single-ended CWO of FIG. 2. As illustrated in FIG. 3, a layout of a CWO according to Gathman, et al. may be dominated by the horseshoe shaped delay paths of each of the traveling-wave stages of the CWO. In particular, each of the four delay paths of the four stage CWO of FIG. 2 are routed separately in the layout of FIG. 3.

A constructive-wave oscillator (CWO) may produce a W-band (75 to 110 GHz) multi-phase signal. Oscillators operating in the W-band may have widespread applications. Exemplary areas of application include medical therapy, defense weapons systems, and telecommunications systems. W-band oscillators may serve as the fundamental frequency inputs to frequency multipliers used to create low-THz frequency signals. In order to be an effective source, W-band oscillators should be capable of producing a strong and stable signal, with low phase noise, low power consumption, and wide bandwidth.

In a CWO, a direction of a forward traveling wave is inherently determined based on the design of the CWO. In some oscillators, such as a rotary traveling wave oscillator (RTWO), the direction of the traveling wave may be dictated by mismatches in the circuit. A wave direction of an RTWO may not be deterministic. To force the wave of an RTWO to travel in a desired direction, a designer may employ special design techniques. In order for these special techniques to work, the gain stage and transmission lines may be designed and implemented properly to reduce the effects of mismatches. The deterministic nature of the traveling wave in a CWO may be advantageous over the RTWO for W-band sources.

SUMMARY

Aspects of the present disclosure provide for a device including a differential transmission line configured to carry a forward traveling wave signal from a differential input port to a differential output port, and a differential feedback amplifier that is configured to amplify the forward traveling wave signal at the differential output port, generate a differential feedback signal, and route the differential feedback signal to the differential input port. The differential transmission line is a single, continuous path arranged into first and second parallel traces and including first and second crossover points, and each of the first and second crossover points provides for a point of inflection between the first and second parallel traces of the differential transmission line. The device further includes a differential delay section that provides for a phase shift between a signal on the first trace and a signal on the second trace. The differential feedback amplifier is configured to attenuate a backward traveling wave signal, and may include two single ended amplifiers.

In another aspect of the disclosure, a device is provided including a single, continuous differential transmission line arranged into first and second parallel traces and including first and second crossover points. Each of the first and second crossover points provides for a point of inflection between the first and second parallel traces of the differential transmission line. The device additionally includes a number of stages, each stage including the first trace carrying a forward traveling wave signal from a differential input port to a differential output port, and the second trace carrying the forward traveling wave signal from the differential input port to the differential output port. A differential delay section provides for a phase shift between a signal on the first trace and a signal on the second trace, and a differential feedback amplifier amplifies the forward traveling wave signal at the differential output port, generates a differential feedback signal, and routes the differential feedback signal to the differential input port. The differential feedback amplifier is configured to attenuate a backward traveling wave signal. Also, the differential feedback amplifier include two single ended amplifiers.

In yet another aspect of the present disclosure, a method is provided including the steps of receiving, at a differential output port along a differential transmission line providing a direct path from a differential input port, a signal including a forward traveling wave. Additional steps include amplifying the signal received at the differential output port, generating a differential feedback signal, and routing the differential feedback signal to the differential input port. The differential transmission line is a single, continuous path arranged into first and second parallel traces and including first and second crossover points. Each of the first and second crossover points provides for a point of inflection between the first and second parallel traces of the differential transmission line. An additional step includes delaying the signal to provide for a phase shift between a signal on the first trace and a signal on the second trace of the differential transmission line.

It is noted that aspects of the inventive concepts described with respect to one embodiment, may be incorporated in a different embodiment although not specifically described relative thereto. That is, all embodiments and/or features of any embodiment can be combined in any way and/or combination. These and other aspects of the inventive concepts are described in detail in the detailed description set forth below.

BRIEF DESCRIPTION OF THE DRAWINGS

The inventive concepts will become more apparent in view of the detailed description and the accompanying drawings.

DETAILED DESCRIPTION OF THE EMBODIMENTS

Figure 1:
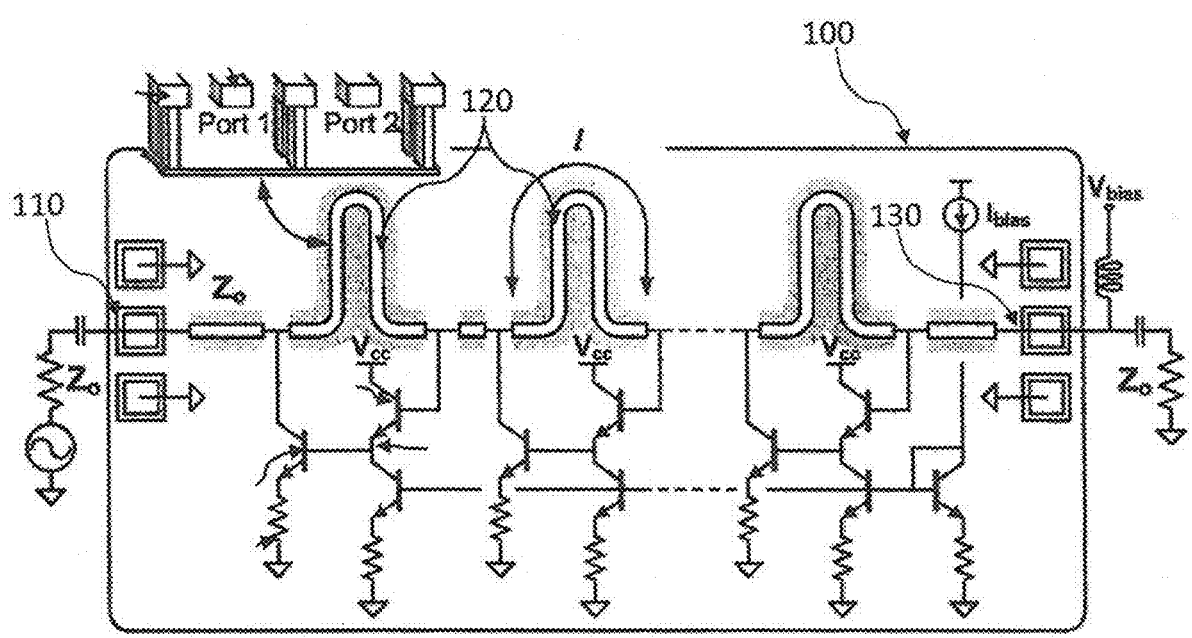
FIG. 1 is a schematic diagram illustrating a prior art cascaded constructive wave amplifier (CCWA).

The inventive concepts will be described more fully hereinafter with reference to the accompanying drawings, in which some embodiments are shown. The embodiments of the inventive concepts may, however, be embodied in different forms and should not be constructed as limited to the embodiments set forth herein. Rather, these embodiments are provided so that this disclosure will be thorough and complete, and will fully convey the scope of the inventive concepts to those skilled in the art.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of inventive concepts. As used herein, the term "and/or" includes any and all combinations of one or more of the associated listed items.

The terminology used herein is for the purpose of describing particular embodiments and is not intended to be limiting of the inventive concepts. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Some embodiments may be described with reference to illustrations that include elements that are similar to or the same as like elements that are previously described with respect to previous illustrations. Reference numerals the same as or similar to those described with respect to the figures may represent the same or similar elements, and descriptions thereof may be omitted or briefly described in the description in order to simplify the description.

Figure 3:
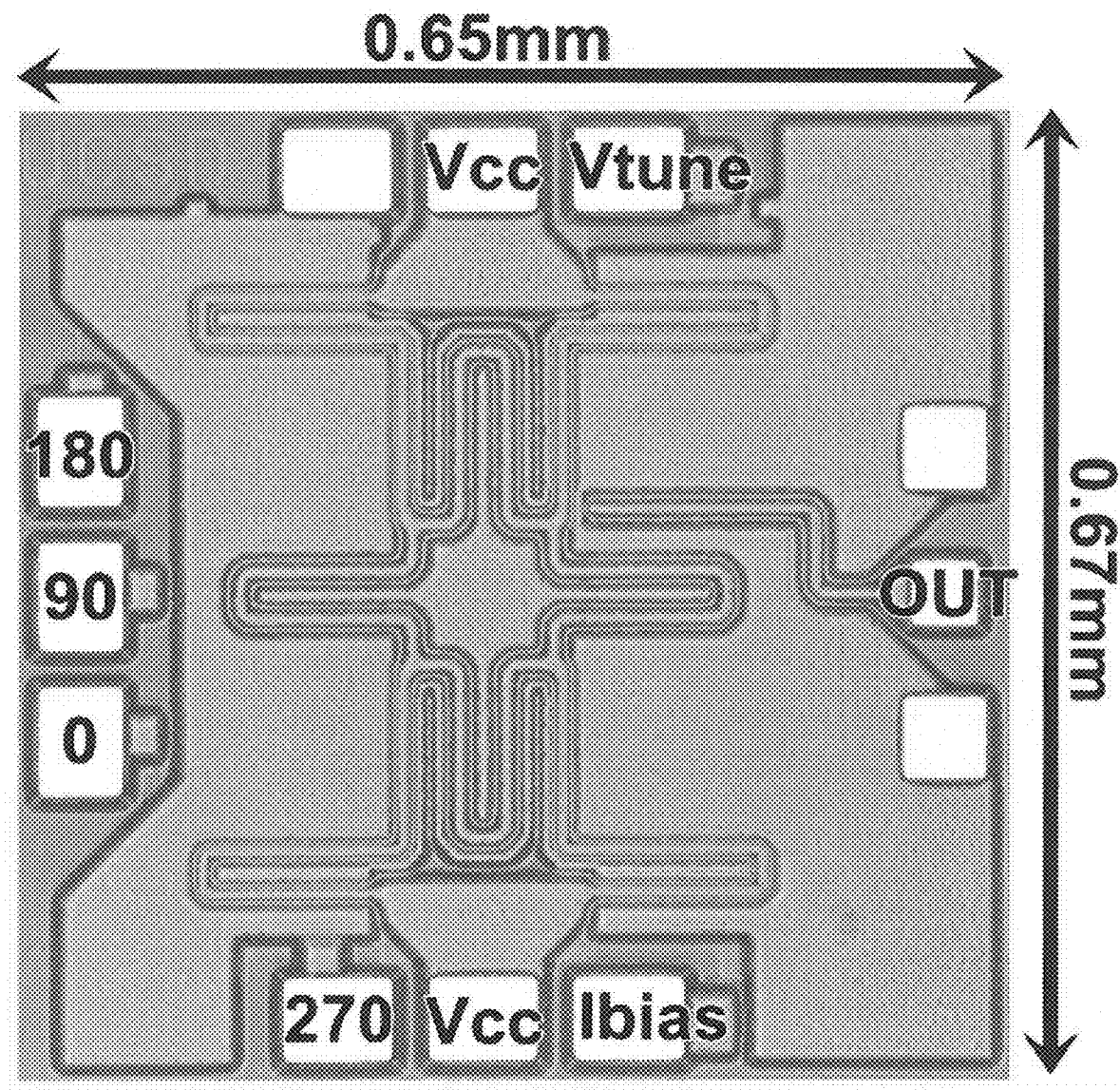
FIG. 3 is a plan view of an implementation of the prior art single-ended CWO of FIG. 2.
Figure 4:
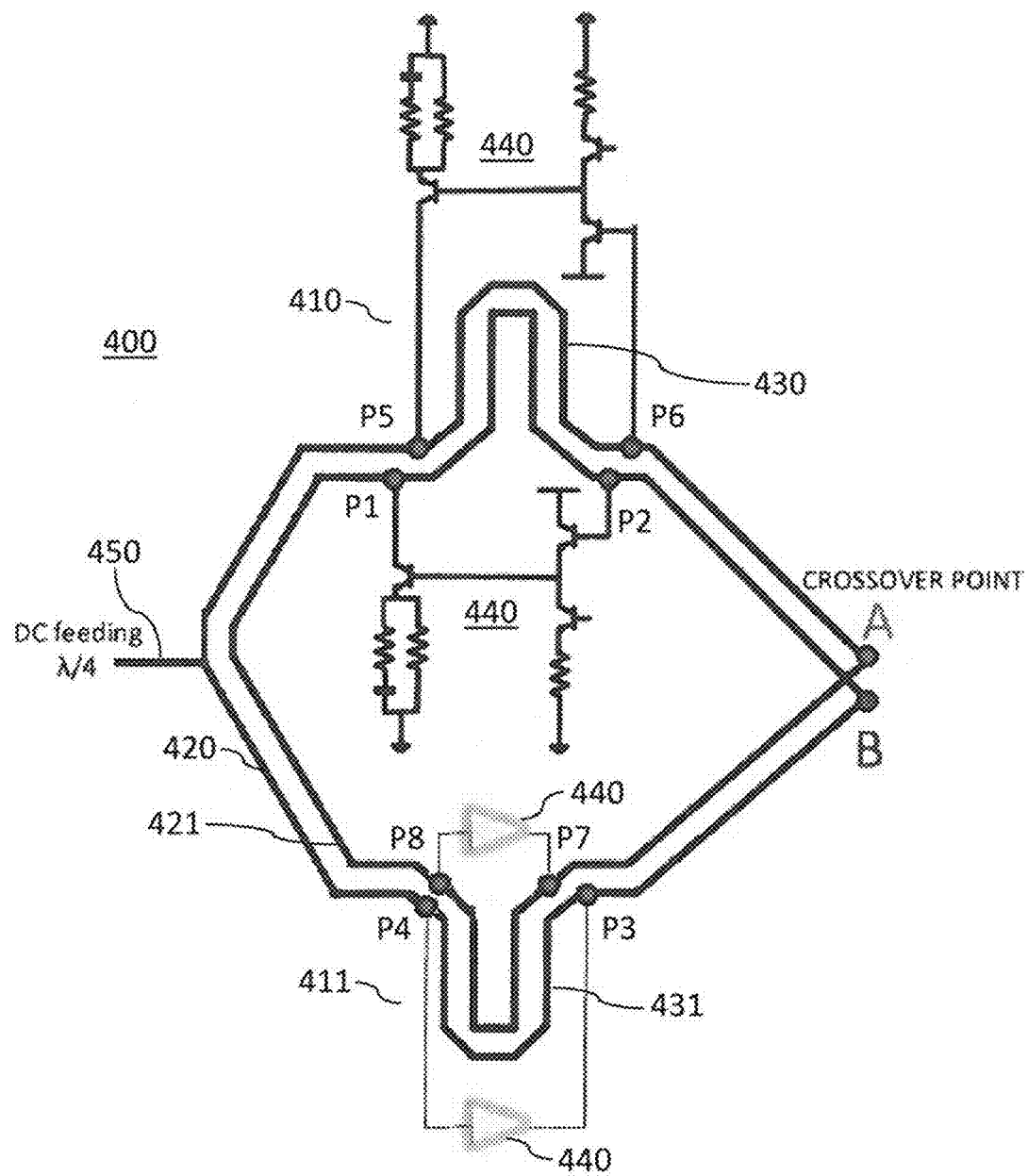
FIG. 4 is a schematic diagram illustrating a 2-stage differential constructive wave oscillator (CWO) according to some embodiments of the inventive concepts.
Figure 5:
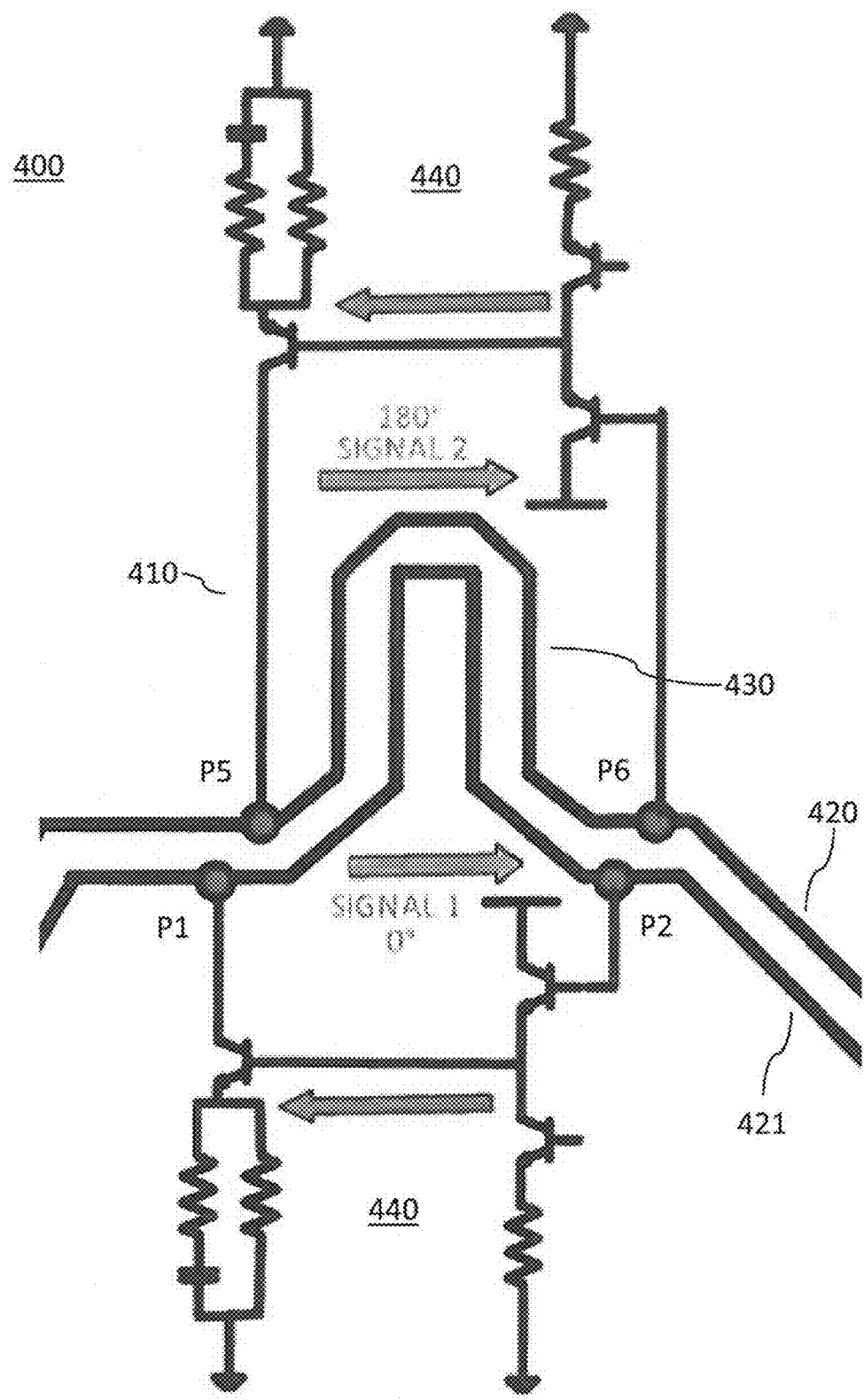
FIG. 5 is an enlarged view of a portion of the 2-stage differential CWO of FIG. 4.

FIG. 4 is a schematic diagram illustrating a 2-stage differential constructive wave oscillator (CWO) according to some embodiments of the inventive concepts. FIG. 5 is an enlarged view of a portion of the 2-stage differential CWO of FIG. 4. Referring to FIGS. 4 and 5, a 2-stage differential CWO 400 may include two differential traveling-wave stages, 410, 411, that are arranged in a continuous ring forming a Mobius loop pattern, as described further below. Each of the differential traveling-wave stages, 410, 411, may include a differential delay section, 430, 431, and a differential feedback amplifier. The 2-stage differential CWO 400 may perform equivalent operations of a single-ended 4-stage constructive wave oscillator, such as the constructive wave oscillator of FIG. 3, as will be described in more detail below.

The continuous ring of the 2-stage differential CWO 400 may be presented as parallel traces, 420, 421, that are arranged as a differential pair in the form of a Mobius loop. A Mobius strip is a surface with only one sick, when embedded in three-dimensional Euclidean space, and only one boundary. It is characterized such that a line drawn starting from the seam down the middle meets back at the seam, but at the other side. If continued, the line meets the starting point, and is double the length of the original strip. This single continuous curve demonstrates that the Mobuis strip has only one boundary. As used herein, the term "Mobius loop" means that, with regards to the circuitry of the differential CWO, the transmission line ring includes a single, continuous circuitry path that is arranged as a pair of stripline traces, an outer trace 420 and an inner trace 421, including a pair of crossover points A, B wherein the outer trace 420 connects to the inner trace 421 and the inner trace 421 connects to the outer trace 420 to form the continuous path. The traces 420 and 421 extend parallel to each other to maintain differential coupling. Accordingly, a signal propagating around the ring may propagate around both the outer trace 420 and the inner trace 421 and back again, effectively doubling the signal path of one trace as is characteristic of a Mobius strip. In some embodiments, the ring may include more than one pair of crossover points A, B. For example, the ring may include, three, five, or another odd number of crossover points A, B.

The ring may include the two delay sections, 430, 431, that may be each configured to provide an approximately 90° delay. The 90° delay may be configured with respect to a target oscillating frequency of the differential CWO 400. For example, the target oscillating frequency may be determined based on the overall length of the ring including the outer trace 420 and the inner trace 421. The delay sections, 430, 431, may be horseshoe shaped sections with lengths that are configured such that a signal at the target oscillating frequency may exit the section approximately 90° out of phase with the signal entering the section. In some embodiments, the delay of the signal across a delay section, 430, 431, may be tuned using one or more active and/or passive components. For example, the delay of the signal across the delay section, 430, 431, may be tuned using one or more varactor diodes. Each of the horseshoe shaped sections may include two traces, one corresponding to the inner trace 421 and the other corresponding to the outer trace 420, that may be differentially coupled to each other.

A signal may propagate across the ring. In more detail, a signal at a point P1 may traverse the inner trace 421 of the upper delay section 430 to arrive at a point P2. The signal may cross over from the inner trace 421 to the outer trace 420 at the crossover point B. The signal may traverse the outer trace 420 of the lower delay section 431 from a point P3 to a point P4. The signal may continue around the ring to traverse the outer trace 420 of the upper delay section 430 from a point P5 to a point P6. The signal may cross over from the outer trace 420 back to the inner trace 421 at the crossover point A. The signal may traverse the inner trace 421 of the lower delay section 431 from a point P7 to a point P8. The signal may continue around the ring back to the point P1, and on accordingly. In other words, as the signal traverses from the point P1 around the inner and outer traces, 421, 420, of the ring to get back to the point P1, the signal may traverse the inner and outer traces, 421, 420, of each of the upper and lower delay sections, 430, 431, across a total of four 90° delay paths with a total delay of 360°, before returning to the same point in the ring. Accordingly, forward traveling waves may be amplified through constructive interference. In one cycle, a signal may travel twice around the ring of a differential CWO due to the characteristic advantage of the path forming a Mobius loop. This in contrast to one cycle of a single-ended CWO, where a signal may travel just once around the ring.

After traversing two 90° delay paths and a crossover point, the signal may arrive at a complementary point of the opposite trace 180° out of phase. In other words, a forward traveling signal at point P1 may traverse the inner trace 421 of the upper delay section 430, cross over to the outer trace 420 at crossover point B, and traverse the outer trace 420 of the lower delay section 431 to arrive at the point P5. The signal at the point P5, having been delayed twice by 90°, may be 180° out of phase with the signal at the point P1. Accordingly, the signals at the points P1 and P5 may be complementary. Moreover, the signals at any other complementary points along the ring, such as points P2 and P6, crossover points A and B, points P3 and P7, points P4 and P8, or any other complementary points of the inner and outer traces, 421, 420, will be 180° out of phase with each other. Accordingly, the signal on the outer trace 420 may be 180° out of phase with the signal on the inner trace 421, and vice versa, at any point along the ring. For example, as illustrated in FIG. 5, a signal 1 on one of the traces may propagate across the ring 180° out of phase from a signal 2 that propagates across the other trace adjacent to the signal 1.

Figure 2:
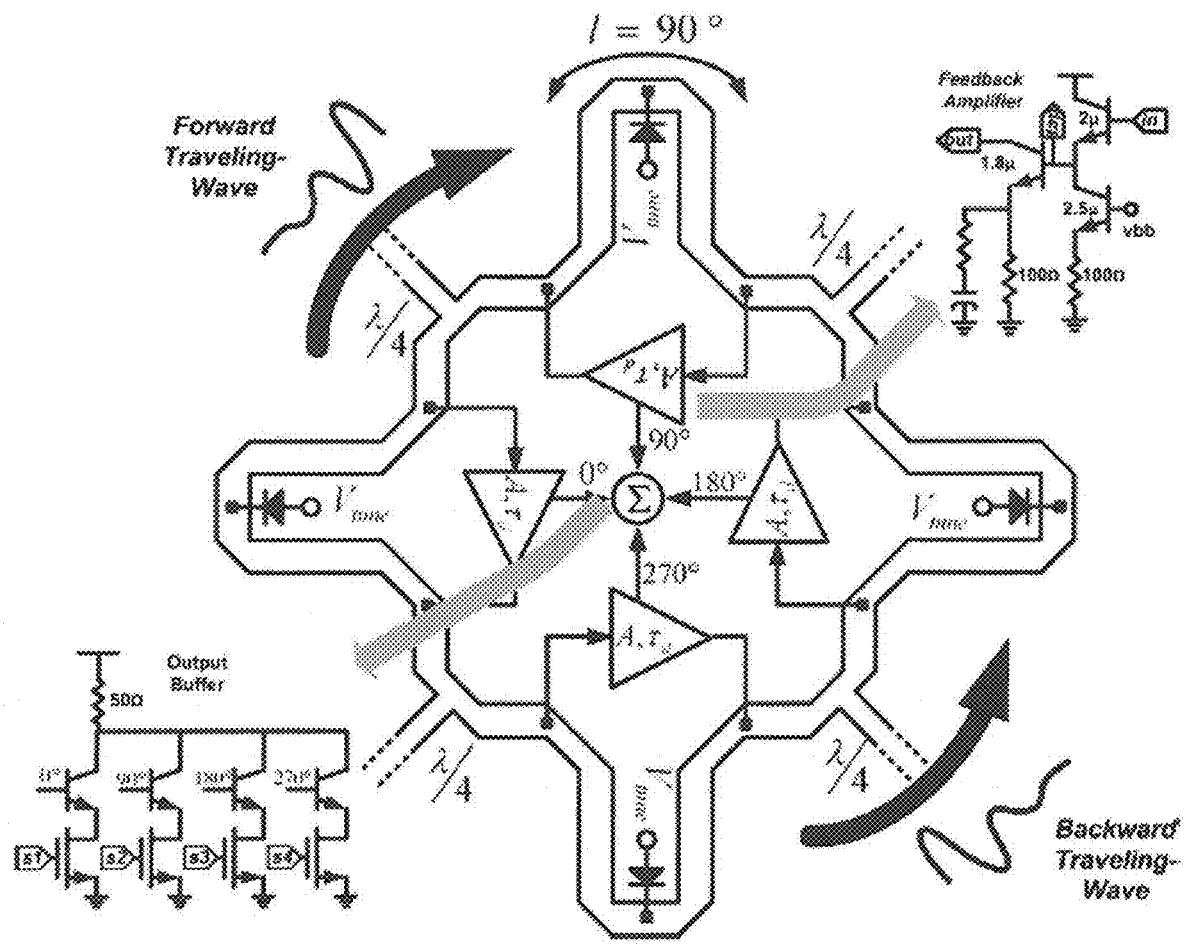
FIG. 2 is a schematic diagram illustrating a prior art single-ended constructive wave oscillator (CWO).

Each of the stages 410, 411 of the differential CWO 400 may include differential feedback amplifiers. For example, the differential CWO 400 may include a first differential feedback amplifier to provide feedback from points P2 and P6 back to points P1 and P5, respectively, and a second differential feedback amplifier to provide feedback from points P4 and P8 back to points P3 and P7, respectively. The feedback amplifiers may be configured to attenuate backward traveling waves. For example, the feedback amplifiers may be configured to provide destructive interference for a differential signal that traverses from the points P2 and P6 across the delay path to the points P1 and P5. In more detail, the differential feedback amplifier may include two single-ended amplifiers 440. For example, the upper stage 410 of FIGS. 4 and 5 may include two single-ended amplifiers 440 that may be similar to or the same as the single-ended amplifiers illustrated in FIGS. 1 and 2. In more detail, the upper stage 410 may include a first amplifier 440 that provides a signal at the point P1 based on an input from the point P2 to provide deconstructive interference for a backward traveling wave that traverses from the point P2 to the point P1 across the inner trace 421 of the upper delay section 430 and may include a second amplifier 440 that provides a signal at the point P5 based on an input from the point P6 to provide deconstructive interference for a backward traveling wave that traverses from the point P6 to the point P5 across the outer trace 420 of the upper delay section 430. Combined, a differential amplifier may include the first and second amplifiers 440 and may provide a differential signal at the points P1 and P5 based on a differential input from the points P2 and P6 to provide deconstructive interference for the complementary backward traveling waves that traverse across the upper delay section 430 from the points P2 and P6 to the points P1 and P5.

Some embodiments may include other forms of pairs of single-ended amplifiers 440 and/or other forms of differential feedback amplifiers. The lower stage 411 of FIG. 4 illustrates a differential feedback amplifier using a pair of generalized buffer symbols. Accordingly, in some embodiments, the lower stage 411 may include any applicable pair of single-ended amplifiers 440 and/or another form of a differential feedback amplifier.

The differential CWO 400 may include one or more DC feeding paths 450. A DC feeding path 450 may provide energy to the differential CWO 400. For example, the DC feeding path 450 may provide a DC voltage to the differential CWO 400. The DC feeding path 450 may include a quarter wavelength transmission line. The DC feeding path 450 may be connected to the inner trace 421 or to the outer trace 420. Same embodiments may include one or more DC feeding paths 450 connected to the inner trace 421 and one or more DC feeding paths 450 connected to the outer trace 420.

While a single pair of crossover points A and B are illustrated in FIG. 4, some embodiments may include more than one pair of crossover points A, B. For example, in some embodiments, the differential CWO 400 may include three, five, or any odd number of pairs of crossover points A, B.

Because the inner and outer traces 421, 420 of each of the delay sections 430, 431 of the differential CWO 400 are routed together as a differential pair, the 2-stage differential CWO 400 may include only two horseshoe shaped sections. Accordingly, a layout of the two horseshoe shaped sections of the 2-stage differential CWO 400 may be smaller than the layout of a 4-stage single-ended CWO, such as the layout illustrated in FIG. 3. Accordingly, one advantage of a differential CWO over a single-ended CWO may be a significant reduction in chip area required for implementation. The differential CWO may have further advantages over an equivalent single-ended CWO, such as improved noise rejection and a reduced far-field radiation pattern based on the differential routing of the traces. Moreover, because complementary signals are routed next to each other in the differential CWO, as opposed to on opposite sides of the single-ended CWO, it may be easier to route complementary signals produced by the differential CWO to destination circuits as an output of the CWO.

Figure 6:
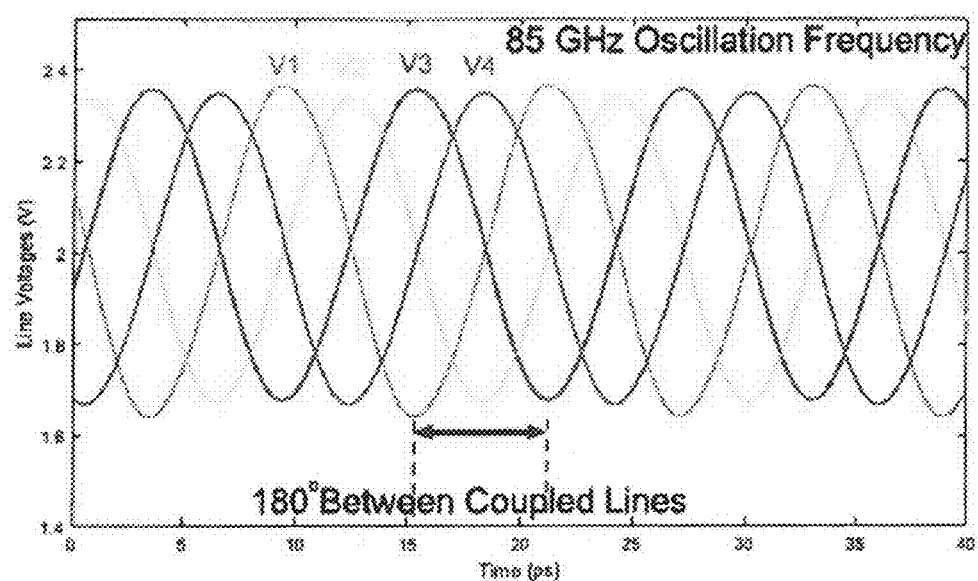
FIG. 6 is a graph illustrating representative signals that may be output from a 2-stage differential CWO, according to some embodiments of the inventive concepts.
Figure 7:
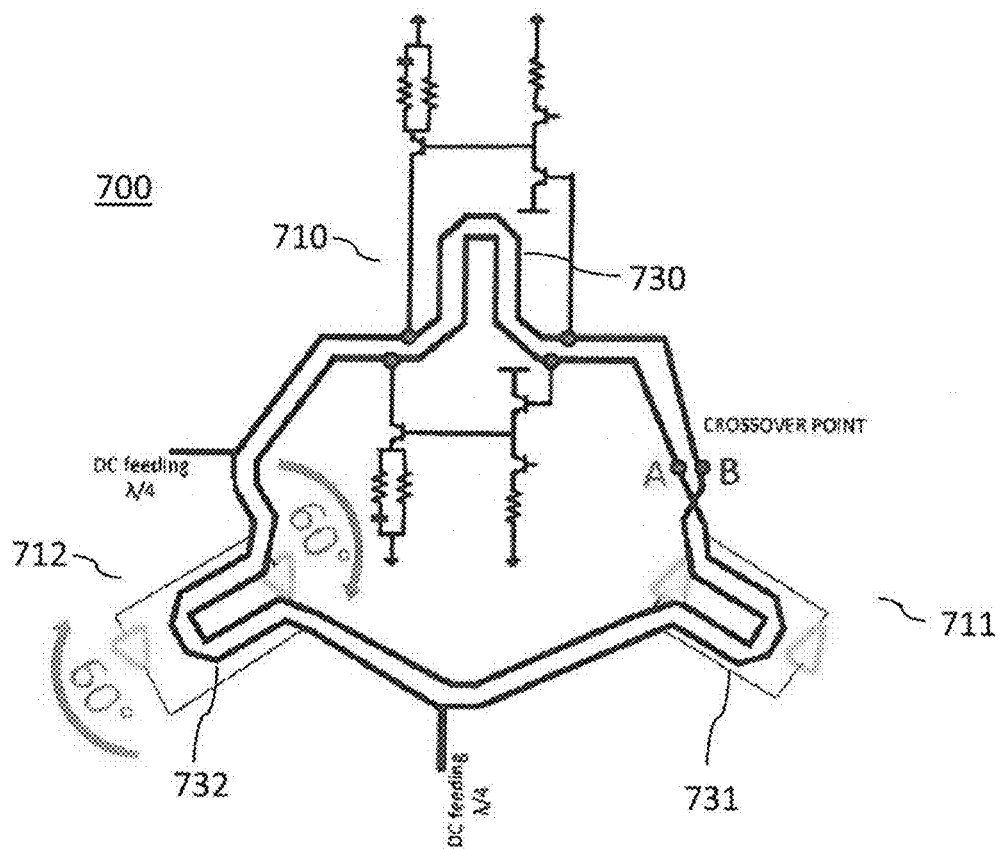
FIG. 7 is a schematic diagram illustrating a 3-stage differential constructive wave oscillator (CWO) according to some embodiments of the inventive concepts.

FIG. 6 is a graph illustrating representative signals that may be output from a 2-stage differential CWO, according to some embodiments of the inventive concepts. Referring to FIGS. 4 and 6, four signals, V1, V2, V3, and V4 may be output from the 2-stage differential CWO 400 of FIG. 4. For example, the signals V1-V4 may be output from intermediate nodes of the feedback amplifiers of the CWO 400. In more detail, the signals V1 and V3 may be output from first and second amplifiers of the upper stage 410 and the signals V2 and V4 may be output from the pair of amplifiers of the lower stage 411. Accordingly, the signals V1 and V3 may be 180° out of phase with each other, the signals V2 and V4 may be 180° out of phase with each other, and each of the signals V1 and V3 may be 90° out of phase with the signals V2 and V4. FIG. 7 is a schematic diagram illustrating a 3-stage differential constructive wave oscillator (CWO) according to some embodiments of the inventive concepts. Referring to FIG. 7, some elements of a 3-stage differential CWO 700 may be the same as or similar to the elements of the 4-stage differential CWO 400 described above with respect to FIGS. 4 and 5. Accordingly, the differences between the 2-stage differential CWO 700 and the 2-stage differential CWO 400 will be primarily described and detailed descriptions of similar elements may be omitted for brevity.

For example, the 3-stage differential CWO 700 may include three differential traveling-wave stages 710, 711, 712 that are arranged in a ring. The 3-stage differential CWO 700 may perform equivalent operations of an equivalent 6-stage single-ended constructive wave oscillator. Each of the three differential traveling-wave stages 710, 711, 712 of the differential CWO 700 may be similar to the differential traveling-wave stages 410, 411 of the differential CWO 400. The 3-stage differential CWO 700 may include at least one pair of crossover points A, B and at least one DC feeding path that may be similar to or the same as the crossover points A, B and the DC feeding path 450 of the 2-stage differential CWO 400.

Each of the stages 710, 711, 712 may include a delay section 730, 731, 732 that may be similar to the delay sections 430, 431 of the 2-stage differential CWO 400. However, each of the delay sections 730, 731, 732 of the 3-stage differential CWO 700 may each be configured to provide an approximately 60° delay. A forward propagating signal may traverse the inner and outer traces of each of the three differential travelling-wave stages 710, 711, 712, across a total of six 60° delay paths with a total delay of 360°, before returning to the same point in the ring. Accordingly, forward traveling waves may be amplified through constructive interference.

After traversing three 60° delay paths and a crossover point, the signal may arrive at a complementary point of the opposite trace 180° out of phase. Accordingly, the signal on the outer trace may be 180° out of phase with the signal on the inner trace, and vice versa, at any point along the ring.

Each of the stages 710, 711, 712 of the 3-stage differential CWO 700 may include differential feedback amplifiers that may be similar to or the same as the differential feedback amplifiers of the stages 410, 411 of the 2-stage differential CWO 400. The feedback amplifiers may be configured to attenuate backward traveling waves.

Because the inner and outer traces of each of the delay sections 730, 731, 732 of the 3-stage differential CWO 700 are routed together as a differential pair, the 3-stage differential CWO 700 may include three differential horseshoe shaped sections. Accordingly, a layout of the three differential horseshoe shaped sections of the 3-stage differential CWO 700 may be smaller than the layout of a 6-stage single-ended CWO, which may include six single-ended horseshoe shaped sections. Accordingly, a significant reduction in chip area may be provided.

Figure 8:
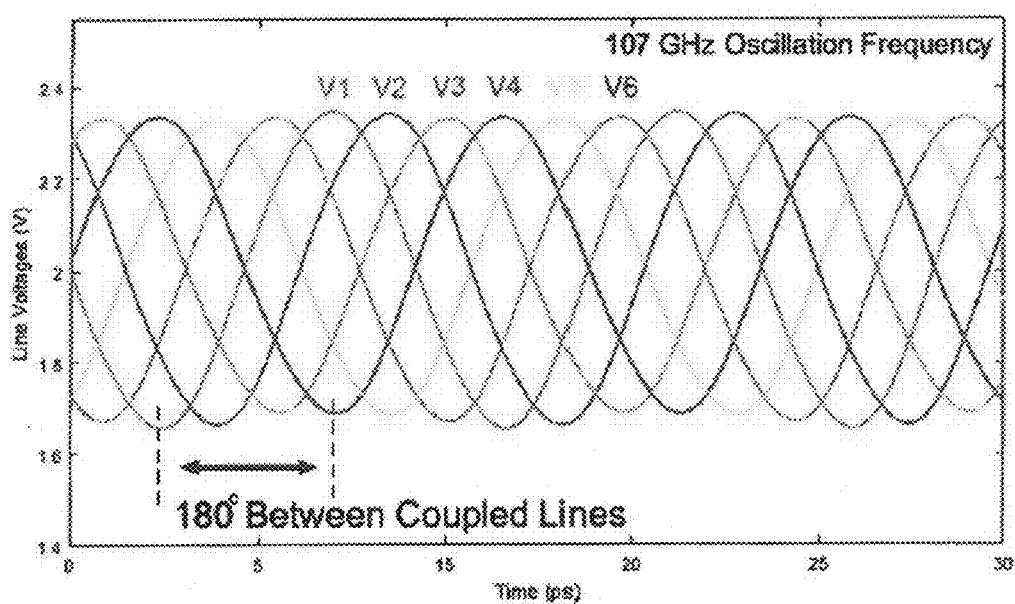
FIG. 8 is a graph illustrating representative signals that may be output from a 3-stage differential CWO, according to some embodiments of the inventive concepts.

FIG. 8 is a graph illustrating representative signals that may be output from a 3-stage differential CWO, according to some embodiments of the inventive concepts. Referring to FIGS. 7 and 8, six signals, V1, V2, V3, V4, V5, and V6 may be output from the 3-stage differential CWO 700 of FIG. 7. For example, the signals V1-V6 may be output from intermediate nodes of the feedback amplifiers of the CWO 700. The signals V1, V2, and V3 may each be 180° out of phase with the signals V4, V5, and V6, respectively, and each of the signals V1-V6 may be 60° out of phase with an adjacent signal.

Figure 9:
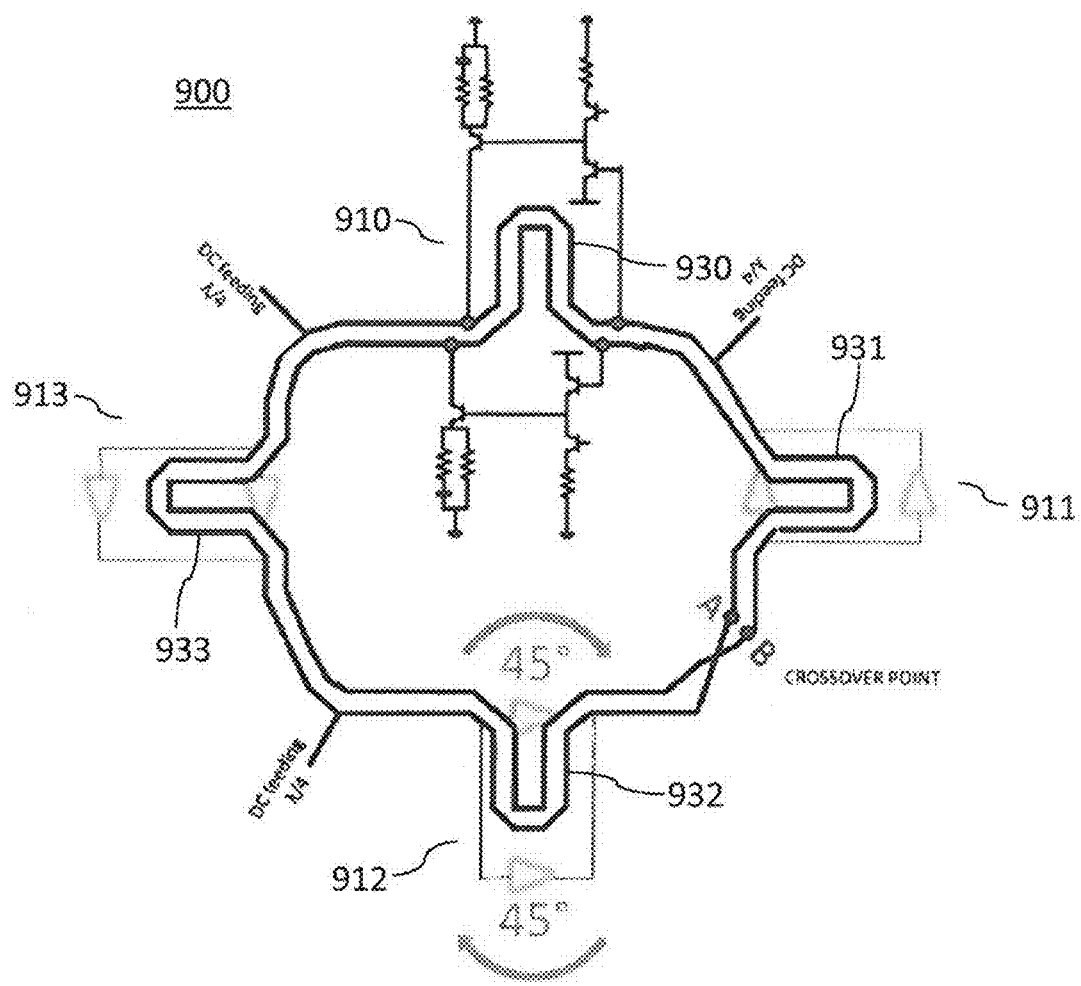
FIG. 9 is a schematic diagram illustrating a 4-stage differential constructive wave oscillator (CWO) according to some embodiments of the inventive concepts.

FIG. 9 is a schematic diagram illustrating a 4-stage differential constructive wave oscillator (CWO) according to some embodiments of the inventive concepts. Referring to FIG. 9, some elements of a 4-stage differential CWO 900 may be the same as or similar to the elements of the 2-stage differential CWO 400 described above with respect to FIGS. 4 and 5 and/or the 3-stage differential CWO 700 described above with respect to FIG. 7. Accordingly, the differences between the 4-stage differential CWO 900 and the 2-stage differential CWO 400 will be primarily described and detailed descriptions of similar elements may be omitted for brevity. For example, the 4-stage differential CWO 900 may include four differential traveling-wave stages 910, 911, 912, 913 that are arranged in a ring. The 4-stage differential CWO 900 may perform equivalent operations of an 8-stage single-ended constructive wave oscillator. Each of the four differential traveling-wave stages 910, 911, 912, 913 of the differential CWO 900 may be similar to the differential traveling-wave stages 410, 411 of the differential CWO 400. The 4-stage differential CWO 900 may include at least one pair of crossover points A, B and at least one DC feeding path that may be similar to or the same as the crossover points A, B and the DC feeding path 450 of the 2-stage differential CWO 400.

Each of the stages 910, 911, 912, 913 may include a delay section 930, 931, 932, 933 that may be similar to the delay sections 430, 431 of the 2-stage differential CWO 400. However, each of the delay sections 930, 931, 932, 933 of the 4-stage differential CWO 900 may each be configured to provide an approximately 45° delay. A forward propagating signal may traverse the inner and outer traces of each of the four differential travelling-wave stages 910, 911, 912, 913, across a total of eight 45° delay paths with a total delay of 360°, before returning to the same point in the ring. Accordingly, forward traveling waves may be amplified through constructive interference.

After traversing four 45° delay paths and a crossover point, the signal may arrive at a complementary point of the opposite trace 180° out of phase. Accordingly, the signal on the outer trace may be 180° out of phase with the signal on the inner trace, and vice versa, at any point along the ring.

Each of the stages 910, 911, 912, 913 of the 4-stage differential CWO 900 may include differential feedback amplifiers that may be similar to or the same as the differential feedback amplifiers of the stages 410, 411 of the 2-stage differential CWO 400. The feedback amplifiers may be configured to attenuate backward traveling waves.

Because the inner and outer traces of each of the delay sections 930, 931, 932, 933 of the 4-stage differential CWO 900 are routed together as a differential pair, the 4-stage differential CWO 900 may include four differential horseshoe shaped sections. Accordingly, a layout of the four differential horseshoe shaped sections of the 4-stage differential CWO 900 may be smaller than the layout of an 8-stage single-ended CWO, which may include eight single-ended horseshoe shaped sections. Accordingly, a significant reduction in chip area may be provided.

Figure 10:
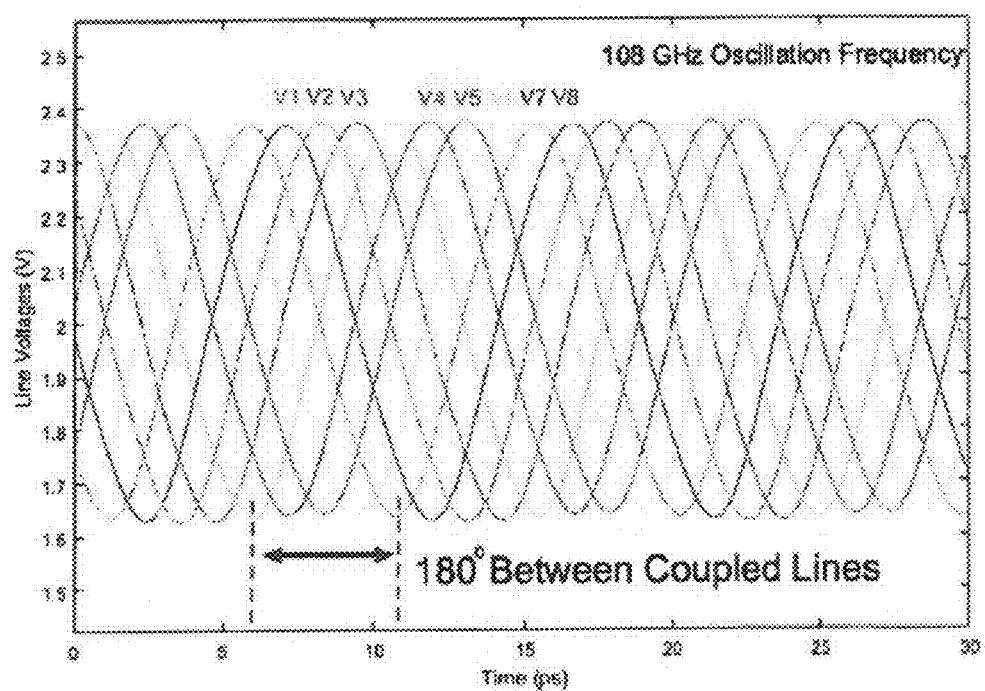
FIG. 10 is a graph illustrating representative signals that may be output from a 4-stage differential CWO, according to some embodiments of the inventive concepts.

FIG. 10 is a graph illustrating representative signals that may be output from a 4-stage differential CWO, according to some embodiments of the inventive concepts. Referring to FIGS. 9 and 10, eight signals, V1, V2, V3, V4, V5, V6, V7 and V8 may be output from the 4-stage differential CWO 900 of FIG. 9. For example, the signals V1-V8 may be output from intermediate nodes of the feedback amplifiers of the CWO 900. The signals V1, V2, V3, and V4 may each be 180° out of phase with the signals V5, V6, V7, and V8, respectively, and each of the signals V1-V8 may be 45° out of phase with an adjacent signal.

Figure 11:
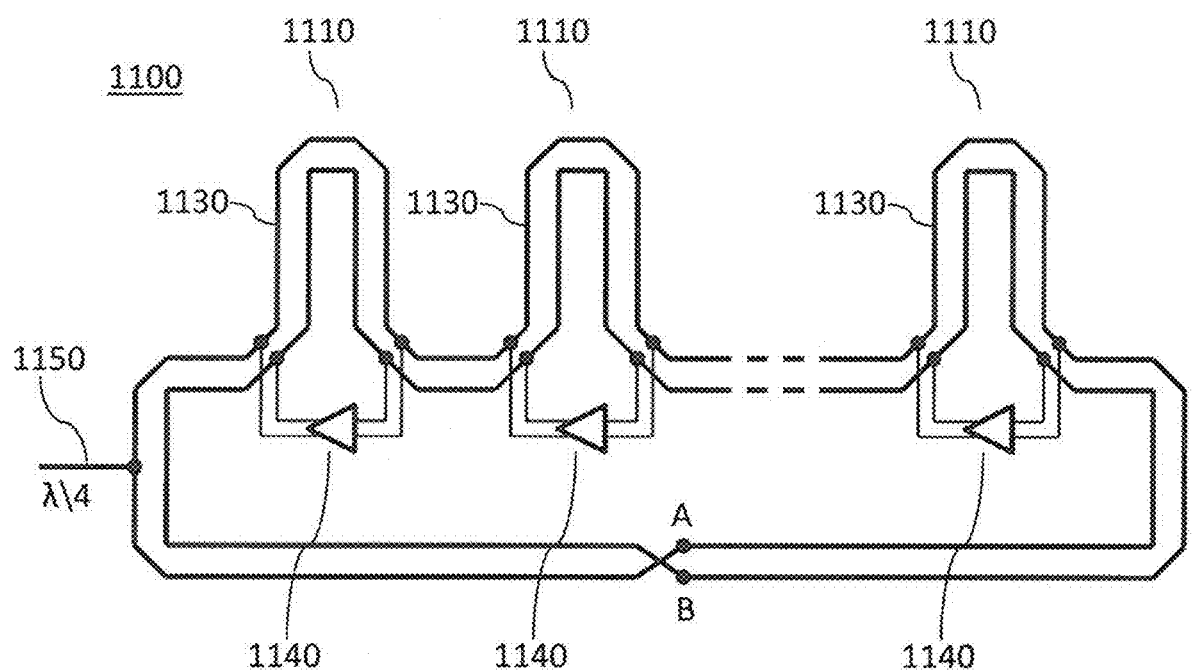
FIG. 11 is a schematic diagram illustrating an n-stage differential constructive wave oscillator (CWO) according to some embodiments of the inventive concepts.

FIG. 11 is a schematic diagram illustrating an n-stage differential constructive wave oscillator (CWO), according to some embodiments of the inventive concepts, wherein n is an integer number. Referring to FIG. 11, some elements of an n-stage differential CWO 1100 may be the same as or similar to the elements of the 2-stage differential CWO 400 described above with respect to FIGS. 4 and 5. Accordingly, the differences between the n-stage differential CWO 1100 and the 2-stage differential CWO 400 will be primarily described and detailed descriptions of similar elements may be omitted for brevity.

For example, the n-stage differential CWO 1100 may include n differential traveling-wave stages 1110 that are arranged in a ring. The n-stage differential CWO 1100 may perform equivalent operations of an equivalent 2n-stage single-ended constructive wave oscillator. Each of the n differential traveling-wave stages 1110 of the differential CWO 1100 may be similar to the differential traveling-wave stages 410, 411 of the differential CWO 400. The n-stage differential CWO 1100 may include at least one pair of crossover points A, B and at least one DC feeding path 1150 that may be similar to or the same as the crossover points A, B and the DC feeding path 450 of the 2-stage differential CWO 400.

Each of the stages 1110 may include a delay section 1130 that may be similar to the delay sections 430, 431 of the 2-stage differential CWO 400. However, each of the delay sections 1130 of the n-stage differential CWO 1100 may each be configured to provide an approximately $(180/n)°$ delay. The delay of the signal across the delay section 1130 may be tuned using one or more active and/or passive components. For example, the delay of the signal across the delay section 1130 may be tuned using one or more varactor diodes. A forward propagating signal may traverse the inner and outer traces of each of the n differential travelling-wave stages 1110 across a total of n quantity of $(180/n)°$ delay paths with a total delay of 360°, before returning to the same point in the ring. Accordingly, forward traveling waves may be amplified through constructive interference.

After traversing a quantity n of the $(180/n)°$ delay paths and a crossover point, the signal may arrive at a complementary point of the opposite trace 180° out of phase. Accordingly, the signal on the outer trace may be 180° out of phase with the signal on the inner trace, and vice versa, at any point along the ring.

Each of the stages 1110 of the n-stage differential CWO 1100 may include differential feedback amplifiers 1140 that may be similar to or the same as the differential feedback amplifiers 440 of the stages of the 2-stage differential CWO 400. The differential feedback amplifiers 1140 may be configured to attenuate backward traveling waves.

Because the inner and outer traces of each of the delay sections 1130 of the n-stage differential CWO 1100 are routed together as a differential pair, the n-stage differential CWO 1100 may include a quantity n of differential horseshoe shaped sections. Accordingly, a layout of the n differential horseshoe shaped sections of the n-stage differential CWO 1100 may be smaller than a layout of a 2n-stage single-ended CWO, which may include a quantity n of single-ended horseshoe shaped sections. Accordingly, a significant reduction in chip area may be provided.

Moreover, in addition to requiring less chip area, the n-stage differential CWO 1100 may have other advantages over a single-ended n-stage single-ended CWO. For example, because the inner and outer traces of the n-stage differential CWO 1100 are routed close together as a differential pair, the complementary signals of the n-stage differential CWO 1100 may have improved supply and substrate noise rejection and a reduced far-field radiation pattern as compared to the single-ended 2n-stage single-ended CWO. Moreover, the n-stage differential CWO 1100 may consume less power than the single-ended n-stage single-ended CWO.

The n-stage differential CWO 1100 may provide a quantity n of differential output signals. For example, a quantity n of differential output signals may be output from intermediate nodes of the feedback amplifiers of the n-stage differential CWO 1100. The n output signals may each be $(180/n)°$ out of phase with adjacent ones of the output signals. The n output signals may be routed to a multiplier circuit that is configured to combine the n output signal into a frequency multiplied signal. For example, the n output signals may be combined at a common collector node of the multiplier circuit. The frequency multiplied signal may have a frequency that is n times higher than a frequency of the n output signals of the n-stage differential CWO 1100.

The inventive concepts relating to differential CWO, as described above, provide particular advantages over prior art CWOs. Unlike prior art single ended CWOs, the differential CWO as described herein incorporates the Mobius loop path to effectively double the signal path without having to increase circuitry hardware. Also, unlike the prior art rotary travelling wave oscillators, the differential CWO as described herein includes the horseshoe shaped delay sections enabling the signal exiting a delay section to be about 90° out of phase with the signal entering such delay section. By uniquely integrating both the Mobius loop signal path, horseshoe delay sections, and differential feedback amplifiers, the differential CWO as described herein provides a differential signal circuit using half of the hardware required for prior art circuitry. Accordingly, the CWO as described costs less to manufacture and emits less radiation than prior art circuitry.

While the inventive concepts have been described with reference to some embodiments, it will be apparent to those skilled in the art that various changes and modifications may be made without departing from the spirit and scope of the inventive concepts. It should be understood that the above embodiments are not limiting, but illustrative. Thus, the scope of the inventive concepts is to be determined by the broadest permissible interpretation of the following claims and their equivalents, and shall not be restricted or limited by the foregoing description.

What is claimed is:

1. A device comprising:
a differential transmission line comprising a single, continuous path arranged into first and second parallel traces, the differential transmission line configured to carry a forward traveling wave signal from a differential output port of a differential feedback amplifier to a differential input port of the differential feedback amplifier; and
the differential feedback amplifier within the differential transmission line that is configured to amplify the forward traveling wave signal at the differential output port, generate a differential feedback signal, and route the differential feedback signal to the differential input port, the differential feedback amplifier comprising:
a first amplifier between a first input port on the first parallel trace and a first output port on the first parallel trace, and
a second amplifier between a second input port on the second parallel trace and a second output port on the second parallel trace;
wherein the differential transmission line further comprises first and second crossover points, each of the first and second crossover points providing for a point of inflection between the first and second parallel traces of the differential transmission line.

2. The device of claim 1, further comprising a differential delay section within the differential transmission line that provides for a phase shift between a signal entering the differential delay section and a signal exiting the differential delay section.

3. The device of claim 1, wherein the differential feedback amplifier is configured to attenuate a backward traveling wave signal.

4. The device of claim 1, wherein the each of the first amplifier and the second amplifier comprises a single ended amplifiers.

5. A device comprising:
a single, continuous differential transmission line arranged into first and second parallel traces and comprising first and second crossover points, wherein each of the first and second crossover points provides for a point of inflection between the first and second parallel traces of the differential transmission line; and
a plurality of stages within the continuous differential transmission line, each stage comprising:
the first parallel trace carrying a forward traveling wave signal from a differential output port of a differential feedback amplifier to a differential input port of the differential feedback amplifier; and
the second parallel trace carrying the forward traveling wave signal from the differential output port of the differential feedback amplifier to the differential input port of the differential feedback amplifier;
a differential delay section that provides for a phase shift between a signal entering the differential delay section and a signal exiting the differential delay section; and
the differential feedback amplifier that is configured to amplify the forward traveling wave signal at the differential output port, generate a differential feedback signal, and route the differential feedback signal to the differential input port, wherein the differential feedback amplifier comprises:
a first amplifier between a first input port on the first parallel trace and a first output port on the first parallel trace, and
a second amplifier between a second input port on the second parallel trace and a second output port on the second parallel trace.

6. The device of claim 5, wherein the differential feedback amplifier is configured to attenuate a backward traveling wave signal.

7. The device of claim 5, wherein the each of the first amplifier and the second amplifier comprises a single ended amplifiers.

8. A method comprising:
receiving, at a differential output port of a differential feedback amplifier along a differential transmission line providing a direct path from a differential input port of the differential feedback amplifier, a signal comprising a forward traveling wave;
amplifying the signal received at the differential output port;
generating a differential feedback signal; and routing the differential feedback signal to the differential input port;

wherein;

the differential transmission line is a single, continuous path arranged into first and second parallel traces and comprising first and second crossover points, each of the first and second crossover points provides for a point of inflection between the first and second parallel traces of the differential transmission line, and the differential feedback amplifier comprises:

a first amplifier between a first input port on the first parallel trace and a first output port on the first parallel trace, and a second amplifier between a second input port on the second parallel trace and a second output port on the second parallel trace.

9. The method of claim 8 further comprising a step of delaying the signal to provide for a phase shift between a signal entering the differential delay section and a signal exiting the differential delay section of the differential transmission line.

10. The device of claim 1, wherein the differential transmission line is configured to carry only the forward traveling wave signal from the differential output port to the differential input port.

11. The device of claim 1, wherein each of the first amplifier and the second amplifier comprises at least one bipolar transistor and at least one resistor.

12. The device of claim 1, wherein the first input port and the second input port form the differential input port.

13. The device of claim 1, wherein the first output port and the second output port form the differential output port.

* * * * *